United States Patent [19]

Abernathey et al.

[11] Patent Number: 4,725,560

[45] Date of Patent: Feb. 16, 1988

[54] SILICON OXYNITRIDE STORAGE NODE DIELECTRIC

[75] Inventors: John R. Abernathey, Essex; David L. Johnson, Jericho; Pai-Hung Pan, Essex Junction; Charles A. Paquette, Saint Albans, all of Vt.

[73] Assignee: International Business Machines Corp., Armonk, N.Y.

[21] Appl. No.: 905,012

[22] Filed: Sep. 8, 1986

[51] Int. Cl.$^4$ ........................................... H01L 21/265
[52] U.S. Cl. ........................ 437/20; 148/DIG. 3; 148/DIG. 13; 148/DIG. 14; 148/DIG. 114; 437/243; 437/247; 437/919; 437/86; 437/28
[58] Field of Search .......... 148/DIG. 114, DIG. 156, 148/188, D14; 29/576 C, 577 C; 427/94, 255.3, 255.2; 357/23.6, 14

[56] References Cited

U.S. PATENT DOCUMENTS

| | | | |
|---|---|---|---|
| 4,112,575 | 9/1978 | Fu et al. | 29/577 C |
| 4,282,270 | 8/1981 | Nozaki et al. | 427/255.3 |
| 4,363,868 | 12/1982 | Takasaki et al. | 427/94 |
| 4,621,277 | 11/1986 | Ito et al. | 357/23.6 |

OTHER PUBLICATIONS

Pan et al., "Properties of Thin LPCVD Silicon Oxynitride Films," J. Electronic Matls., vol. 14, No. 5, Sep. 1985, pp. 617–632.

Remmerie et al., "Physical and Electrical Characterization of LPCVD Oxynitride Layers," *Insulating Films on Semiconductors*, 1985.

Gaind et al., "Physiochemical Properties of Chemical Vapor-Deposited Silicon Oxynitride from a SiH$_4$—CO$_2$—NH$_3$—H$_2$ System," J. Electrochem. Soc., vol. 125, No. 1, pp. 139–145, Jan. 1978.

*Primary Examiner*—Brian E. Hearn
*Assistant Examiner*—Mary A. Wilczewski
*Attorney, Agent, or Firm*—C. Lamont Whitham; Michael E. Whitham

[57] ABSTRACT

An annealing process carried out at 800° C. in a wet O$_2$ ambient permits the manufacture of a reliable storage capacitor wherein the dielectric layer is comprised of silicon oxynitride formed by low pressure chemical vapor deposition (LPCVD). The manufacturing process includes first depositing the silicon oxynitride film by LPCVD, second annealing in wet O$_2$ at 800° C. or N$_2$ at 1000° C., third forming an N-type region in the silicon substrate by As+ ion implantation through the silicon oxynitride film, fourth annealing in wet O$_2$ at 800° C., and fifth depositing an electrode.

10 Claims, 28 Drawing Figures

LOT #1, 1ST PASS

LOT #1, 2ND PASS

LOT #2, 1ST PASS

LOT #2, 2ND PASS

LOT #1, 1ST PASS

LOT #1, 2ND PASS

LOT #2, 1ST PASS

LOT #2, 2ND PASS

LOT #1, 1ST PASS

LOT #1, 2ND PASS

LOT #2, 1ST PASS

LOT #2, 2ND PASS

FIG. 3A
LOT #1, 1ST PASS
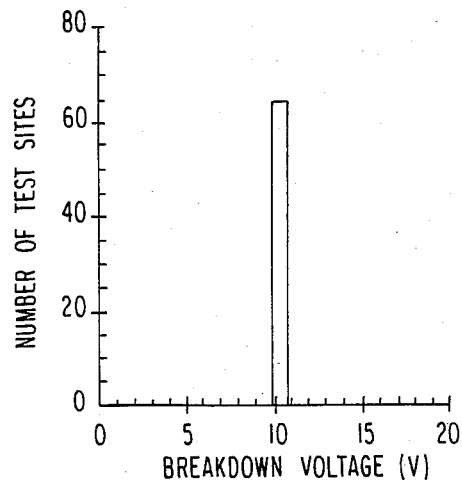
FIG. 3B
LOT #1, 2ND PASS
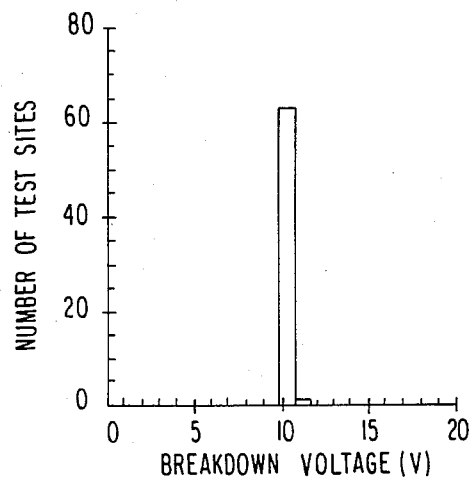
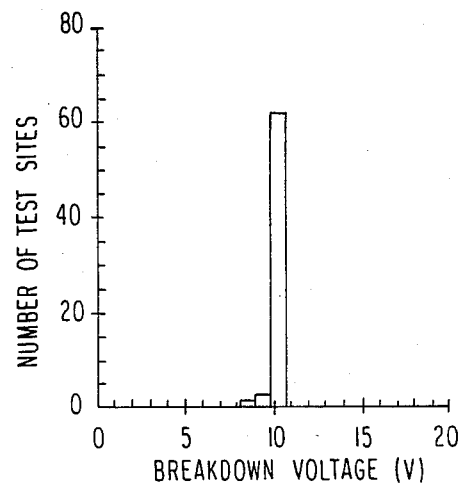
FIG. 3C
LOT #2, 1ST PASS
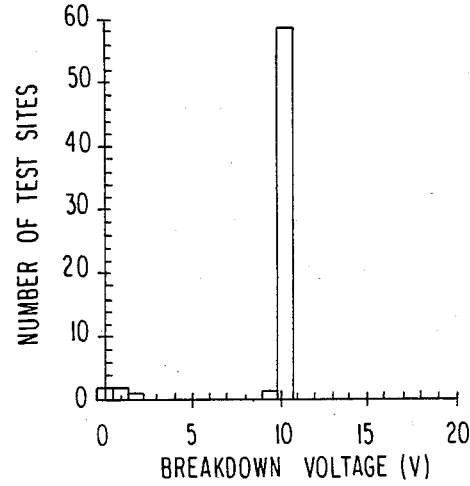
FIG. 3D
LOT #2, 2ND PASS

LOT #1, 1ST PASS

LOT #1, 2ND PASS

LOT #2, 1ST PASS

LOT #2, 2ND PASS

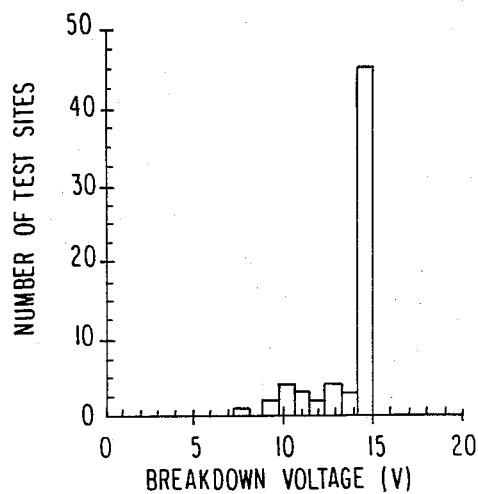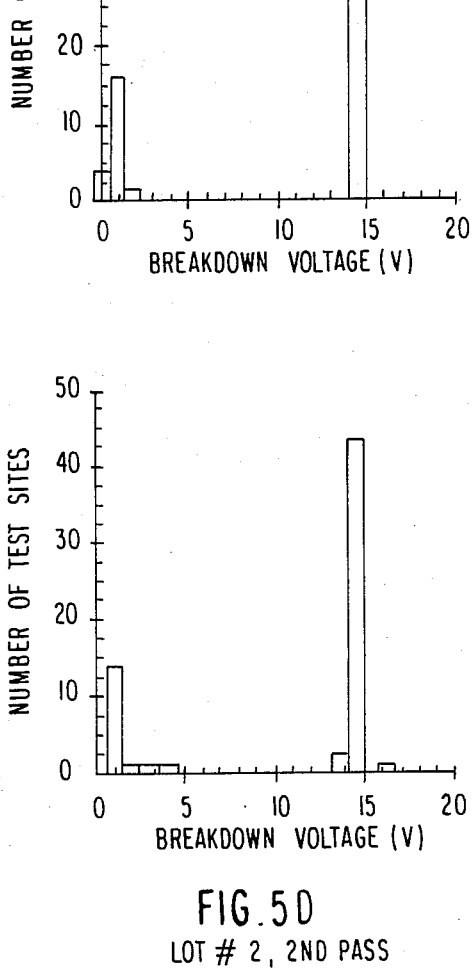

LOT #1, 1ST PASS

LOT #1, 2ND PASS

LOT #2, 1ST PASS

LOT #2, 2ND PASS

LOT #1, 1ST PASS

LOT #1, 2ND PASS

LOT #2, 1ST PASS

LOT #2, 2ND PASS

SILICON OXYNITRIDE STORAGE NODE DIELECTRIC

BACKGROUND OF THE INVENTION

1. Field of the Invention

The present invention generally relates to semiconductor memories and, more particularly, to the process of forming a high yield and reliable storage node when a low pressure chemical vapor deposited (LPCVD) silicon oxynitride dielectric film is used as a storage capacitor.

2. Description of the Prior Art

Thin film insulators are key materials in semiconductor integrated circuits, particularly in regard to their application as storage node dielectrics for the storage capacitor of the so-called "one device" dynamic random access memory (DRAM) cell. Typically, a thin film dielectric is thermally grown or deposited on a silicon wafer, and then a metal or polysilicon electrode is deposited on top of the thin film to form the charge plate of the capacitor.

Until recently, silicon dioxide ($SiO_2$) films have been the most widely used dielectric films due to the stable $SiO_2$/Si interface and the good insulating properties of $SiO_2$ films. However, the dielectric constant of $SiO_2$ is only 3.9. In present day dynamic random access memory cells wherein the thicknesses of the dielectric film are in the 10–15 nanometer (nm) range, a high yield and reliable $SiO_2$ film is difficult to grow. Moreover, the defect density of thin $SiO_2$ films within this thickness range also requires very tight control over a host of sensitive process conditions. More recently, silicon nitride ($Si_3N_4$) films have been utilized as storage node dielectrics. $Si_3N_4$ has a dielectric constant of 7, which is significantly higher than $SiO_2$. As such, a thicker layer may be used to improve yield and to reduce process sensitivity. Unfortunately, the d.c. leakage of $Si_3N_4$ is much higher than that of $SiO_2$. Moreover, $Si_3N_4$ films may produce film stresses of sufficient magnitude to generate crystal lattice dislocations in the underlaying silicon substrate.

Zimmer in U.S. Pat. No. 4,140,548 discloses a method of making a metal oxide semiconductor (MOS) which utilizes a two layer oxide. One of the layers is thermal $SiO_2$ and the other layer is deposited $SiO_2$. The very thin layer of thermal $SiO_2$ is formed by heating a silicon wafer in dry $O_2$ at 950° C.

Barile et al in U.S. Pat. No. 3,793,090 disclose an example of a composite of silicon dioxide-silicon nitride film used as the gate dielectric of a field effect transistor (FET). The composite film is annealed in dry oxygen at a temperature of 1050° C. In the Barile et al process a thin layer of silicon oxynitride forms on top of the nitride layer should the $O_2$ anneal be carried out prior to depositing the gate electrode.

U.S. Pat. No. 4,543,707 to Ito et al shows plasma chemical vapor deposited silicon oxynitride used as an electrode dielectric. Ito et al disclose that silicon oxynitride acts as a strong barrier against contaminants such as water, alkali ions, and other impurities. Ito et al also state that because of the high dielectric constant of silicon oxynitride, a high field threshold voltage can be obtained. The patent is generally related to stacking silicon oxynitride layers of different compositions on top of one another by varying the N/O ratio. The stacked silicon oxynitride layers tend to etch at different rates.

U.S. Pat. No. 3,886,000 by Bratter et al discloses a semiconductor device in which silicon oxynitride is deposited by the reaction of carbon dioxide, ammonia, and silane. In this patent the silicon oxynitride is thermally oxidized to $SiO_2$.

Many patents have been issued relating to annealing processes that overcome various difficulties encountered in processing semiconductor films. An "anneal" is a heating process which drives out impurities from an exposed film, introduces elements that are present in the anneal ambient into the film, and densifies the film. U.S. Pat. No. 4,001,049 to Baglin et al discloses a particular ion radiation treatment of amorphous $SiO_2$ film with a subsequent annealing procedure which improves the dielectric breakdown property of the film. The temperature range for annealing is from 200° C. to 800° C. U.S. Pat. No. 4,364,779 to Kamgar et al discloses a double annealing step for radiation hardening. U.S. Pat. No. 4,397,695 to Arit et al discloses a method for stabilizing the current gain of NPN-Silicon transistors which includes two separate annealing processes at different temperatures. U.S. Pat. No. 4,329,773 to Geipel, Jr. et al discloses a process in which a wet oxygen (steam) anneal is carried out on a substrate having implanted arsenic ions. Little or no alteration of the arsenic ($As^+$) concentration profile occurs when the anneal is carried out between the temperatures of 850° C. and 1000° C. Burkhardt et al in IBM Technical Disclosure Bulletin, Vol. 18, No. 3, August 1975, page 753, disclose a post oxidation anneal procedure using a radio frequency (RF) heated susceptor which reduces mobile ion charge levels. Gardner in IBM Technical Disclosure Bulletin, Vol. 17, No. 1, June 1974, page 117, discloses a field-effect transistor gate annealing to reduce fixed charges in an $SiO_2$ layer.

P. H. Pan, J. Abernathy, and C. Schaeffer showed in an article appearing in The Journal of Electronic Materials, Vol. 14, No. 5, Sept. 1985, pages 617 to 632, that silicon oxynitride films deposited by LPCVD techniques are dominated by a mixed matrix of silicon, nitrogen, and oxygen, which may be expressed as ($Si_x$—$O_y$—$N_z$). The silicon oxynitride films were deposited in a hot wall LPCVD reactor at 800° C. The reactant gases were ($SiH_2Cl_2$), ammonia ($NH_3$), and nitrous oxide ($N_2O$). The total deposition pressure was 0.3 Torr. Samples with refractive indices (n) ranging from 1.65 to 1.85 were obtained by varying the $N_2O/(N_2O+NH_3)$ gas ratio from 0.1 to 0.5. The film composition and structure of the LPCVD silicon oxynitride film was analyzed using Auger electron spectroscopy (AES), X-ray photoelectron spectroscopy (XPS), and infrared techniques. Thermal $SiO_2$ and LPCVD $Si_3N_4$ films were used as a standard to determine the concentration of O, N, and Si. The Auger depth profile results indicated good compositional uniformity as a function of depth. The XPS peak for silicon oxynitride (103.1 eV) was between the peaks for $SiO_2$ (104 eV) and $Si_3N_4$ (102.7 eV). Fourier transform infrared (FTIR) spectra indicated a broad Si—O—N stretching bond between 1080 $cm^{-1}$ and 840 $cm^{-1}$. High frequency (1 MHz) and quasi-static capacitor-voltage (C-V) measurements were used to determine the flatband voltage and surface state density. The breakdown voltage was defined as the voltage across an insulator when a current level of 10 microampere is conducted through the film. It was found that the average breakdown strength (i.e., the breakdown voltage divided by the film thickness) of the film as deposited (i.e., prior to any further processing such as implantation) was greater than 12 MV/cm and the deviation was less than 2 MV/cm. The conduction of these films before and after annealing (900° C. in $N_2$ or $O_2$) was also discussed. The anneal cycle was found to reduce the positive charge and leakage currents in the oxynitride film.

In general, there is no teaching in the prior art of an anneal process that would materially improve the breakdown voltage of silicon oxynitride films after they have been processed for application as a storage node dielectric.

SUMMARY OF THE INVENTION

It is therefore an object of this invention to provide a method of overcoming the low voltage breakdown difficulties of silicon oxynitride for use as a storage node dielectric.

It is another object of this inventions to provide a unique annealing process which decreases the propensity of low voltage breakdown in LPCVD silicon oxynitride films.

It is another object of the invention to provide a method of making a high quality insulating film which may be used in transfer gates and storage capacitors in dynamic random access memory cells.

According to the present invention, a unique annealing process materially improves the yield and breakdown voltage of silicon oxynitride films. Thin films of silicon oxynitride are deposited by LPCVD onto a silicon substrate at a relatively low temperature over a short period of time. After deposition the film is annealed at 800° C. in wet $O_2$ or at 1000° C. in dry $N_2$ to reduce the positive charge accumulated during deposition while also densifying the film. The silicon wafer is then subjected to an $As^+$ ion implantation through the oxynitride film to form a thin N-type silicon layer under the oxynitride film that enhances the capacitance of the resulting storage node. The silicon oxynitride is cleaned by ash or brush cleaning to remove contamination (e.g., carbon) caused by $As^+$ ion implantation. The silicon oxynitride film is then subjected to a second anneal between 700° C. and 1000° C. in wet $O_2$. This second anneal process occurs just prior to electrode deposition of either polysilicon or metal. It has been found that this combination of steps results in silicon oxynitride films having particularly tight breakdown distribution and high breakdown voltages. These high yield and high breakdown voltages make LPCVD silicon oxynitride films more feasible as a dielectric for a storage node of a dense dynamic random access memory.

BRIEF DESCRIPTION OF THE DRAWINGS

The foregoing and other objects, aspects and advantages of the invention will be better understood from the following detailed description of the preferred embodiments of the invention with reference to the accompanying drawings, in which:

FIGS. 3a-3d are graphs showing the breakdown distribution of a silicon oxynitride film (~8 nm) deposited by LPCVD, brush cleaned, and wet $O_2$ annealed, with a polysilicon electrode disposed on its upper surface;

FIGS. 5a-5d are graphs showing the breakdown distribution of a silicon oxynitride film (~12 nm) deposited by LPCVD, $N_2$ annealed, bombarded with $As^+$ ions implanted into the silicon wafer, ash cleaned, brush cleaned, and $N_2$ annealed, with an aluminum electrode disposed on its upper surface;

DETAILED DESCRIPTION OF THE PREFERRED EMBODIMENTS OF THE INVENTION

There will now be described a high yield process for creating a silicon oxynitride dielectric layer having a high breakdown voltage for storage capacitor applications.

The following process was carried out on a clean <100> P-type silicon wafer substrate. The silicon oxyntride is deposited on the substrate by LPCVD techniques to form a thin dielectric layer ($\leq 15$ nm). The film is deposited in a hot-walled LPCVD reactor by reacting $SiH_2Cl_2$ (25 sccm), $NH_3$ (20 sccm), and $N_2O$ (60 sccm) at a pressure of 0.35 Torr and a temperature between 700° C. and 900° C. Particularly good results have been obtained at a deposition temperature of 820° C. The refractive index of the resulting silicon oxynitride film is in the order of 1.65 to 1.85. Using the specific conditions noted above, the resulting refractive index is 1.755. The deposition rate is approximately 1.5 nm/min. The resulting silicon oxynitride matrix is of good compositional uniformity with respect to depth.

Figure 1A:
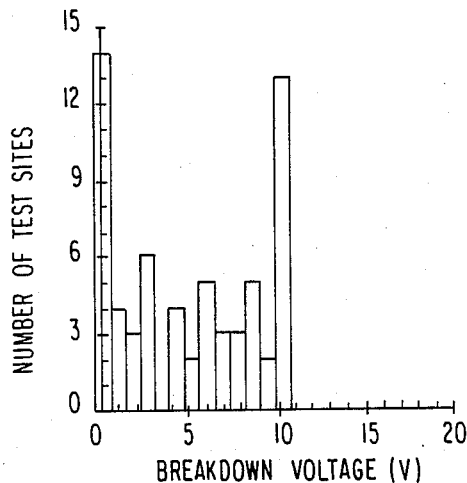
FIGS. 1a-1d are graphs showing the breakdown distribution of a silicon oxynitride film (~8 nm) deposited by LPCVD and brush cleaned, with a polysilicon electrode disposed on its upper surface.
Figure 1B:
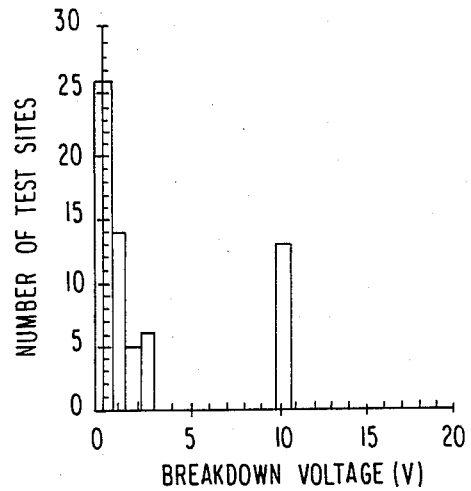
Figure 1C:
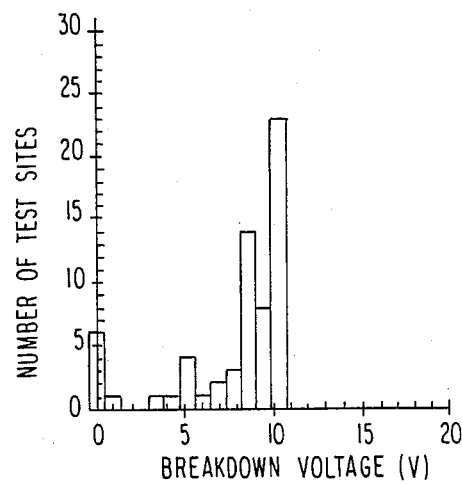
Figure 1D:
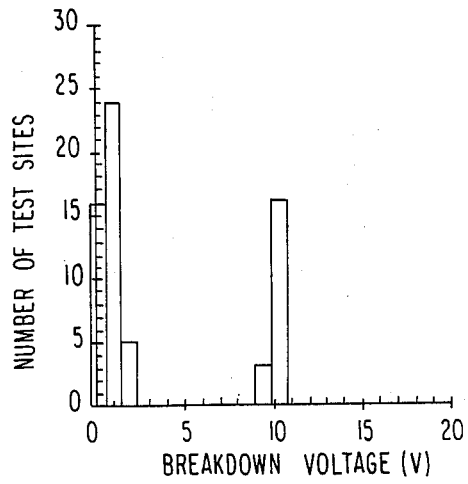
Figure 2A:
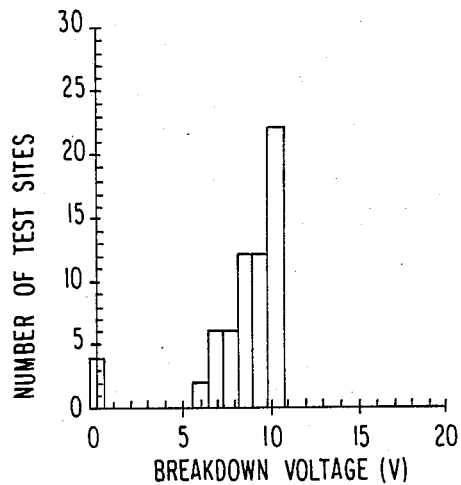
FIGS. 2a-2d are graphs showing the breakdown distribution of a silicon oxynitride film (~8 nm) deposited by LPCVD, brush cleaned, and $N_2$ annealed, with a polysilicon electrode disposed on its upper surface.
Figure 2B:
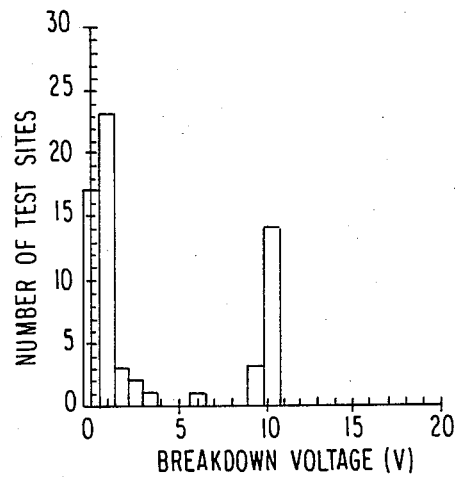
Figure 2C:
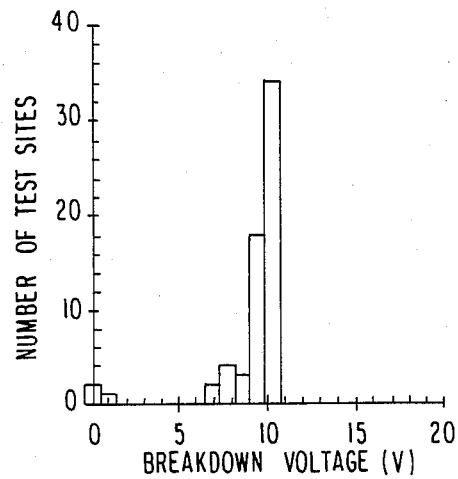
Figure 2D:
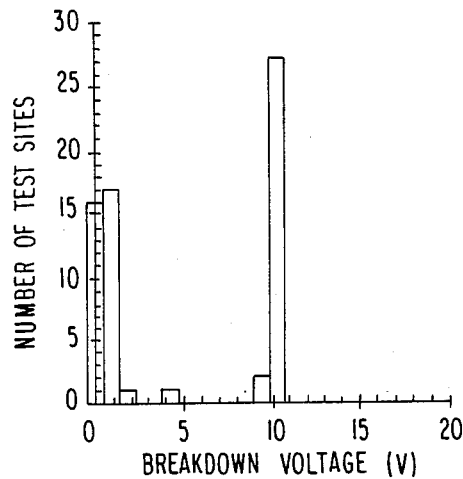
Figure 4A:
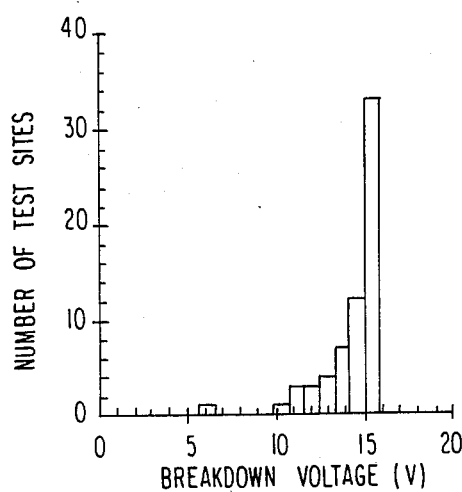
FIGS. 4a-4d are graphs showing the breakdown distribution of a silicon oxynitride film (~12 nm) deposited by LPCVD, wet $O_2$ annealed, bombarded with $As^+$ ions implanted into the silicon wafer, ash cleaned, brush cleaned, and $N_2$ annealed, with an aluminum electrode disposed on its upper surface.
Figure 4B:
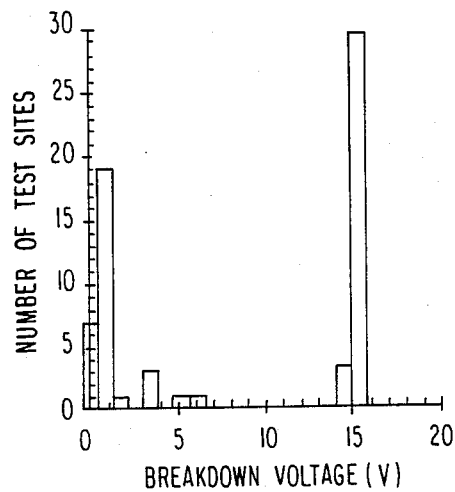
Figure 4C:
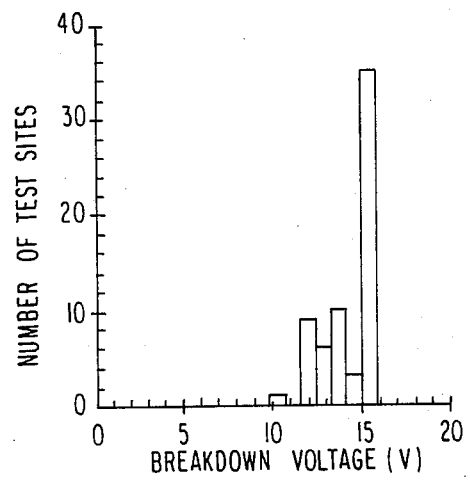
Figure 4D:
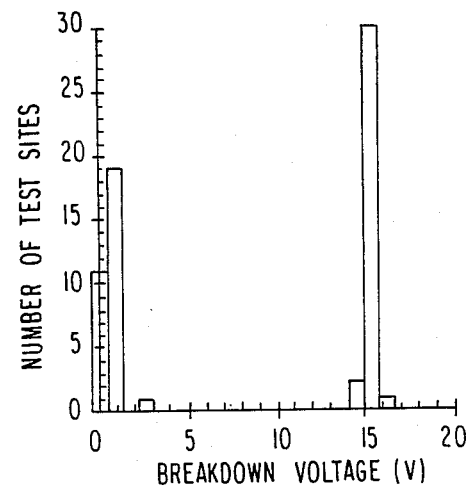
Figure 6A:
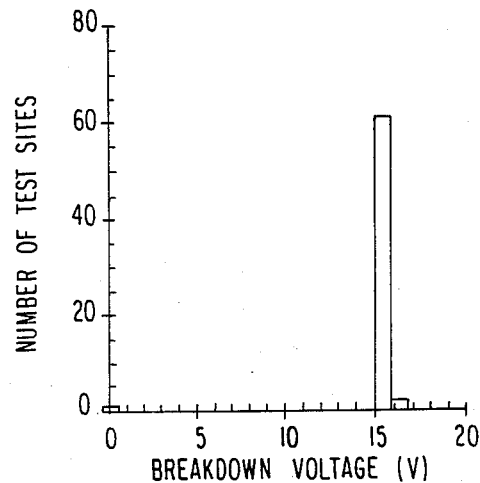
FIGS. 6a-6d are graphs showing the breakdown distribution of a silicon oxynitride film (~12 nm) deposited by LPCVD, $N_2$ annealed, bombarded with $As^+$ ions implanted into the silicon wafer, ash cleaned, brush cleaned, and wet $O_2$ annealed, with an aluminum electrode disposed on its upper surface.
Figure 6B:
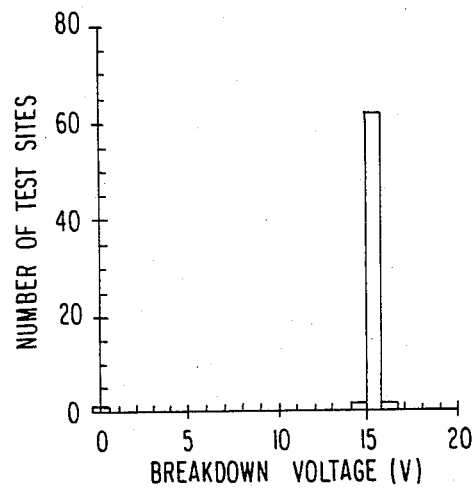
Figure 6C:
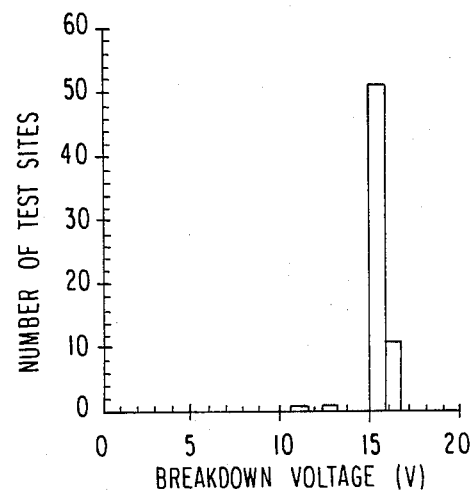
Figure 6D:
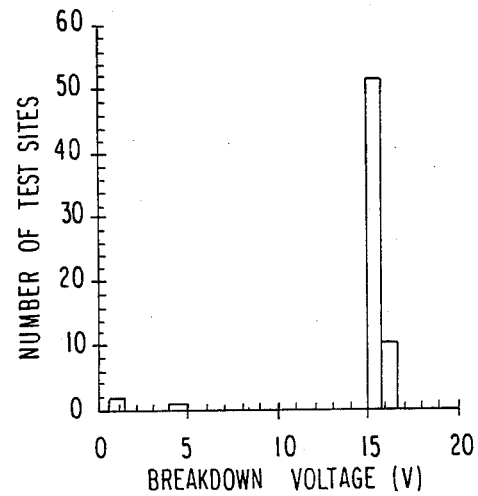
Figure 7A:
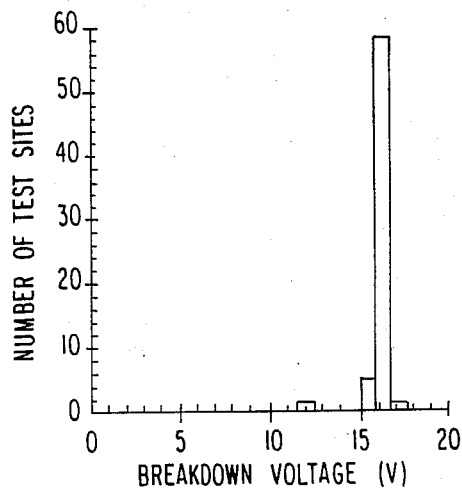
FIGS. 7a-7d are graphs showing the breakdown distribution of a silicon oxynitride film (~12 nm) deposited by LPCVD, wet $O_2$ annealed, bombarded with $As^+$ ions implanted into the silicon wafer, ash cleaned, brush cleaned, and wet $O_2$ annealed, with an aluminum electrode disposed on its upper surface.
Figure 7B:
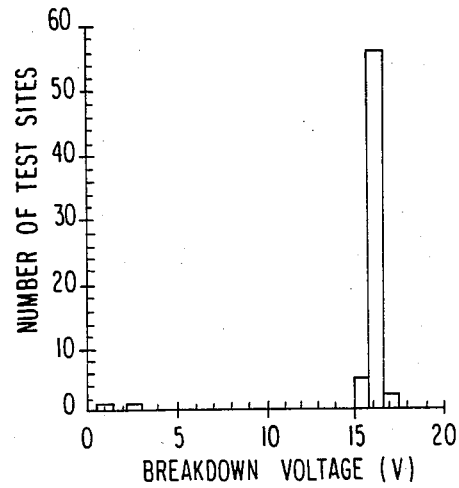
Figure 7C:
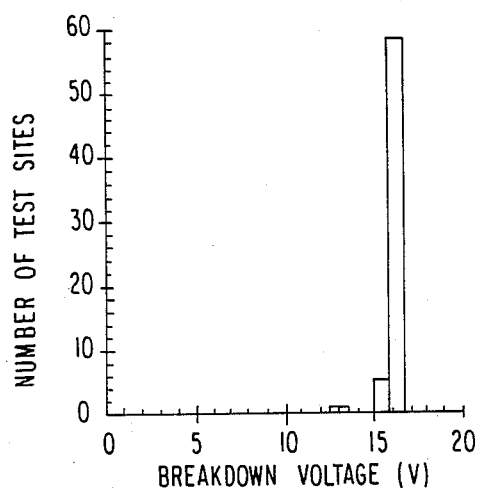
Figure 7D:
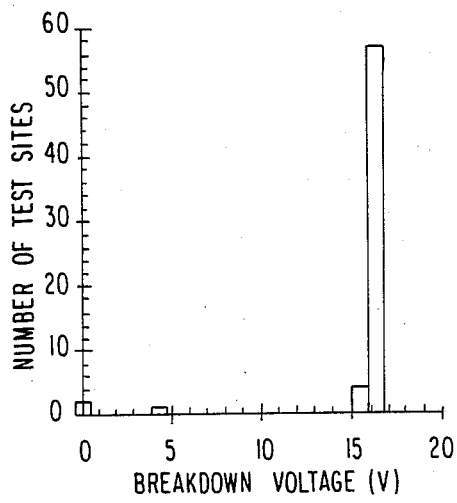

The above-described silicon oxynitride film was then processed in several different ways in an attempt to discern which method produced the highest yield and breakdown voltage. Referring to the drawings, the figures show the breakdown distribution resulting from these various processes. For each process, two different lots of wafers were processed and tested. Each lot consisted of eight wafers; each wafer had eight test sites that were individually monitored. The graphs show the number of test sites that exhibited breakdown at given voltages, for two sequential stress tests. For the first stress test (indicated in the figures as "1st Pass"), a voltage of 0-20 volts was applied to each test site to determine the initial yield. As shown in the graphs, "breakdown voltage" is defined as the applied voltage at which a current of 10 $\mu$A flows through the film. For example, test sites that exhibited a breakdown voltage of 0 to 3 volts conducted more current than the 10 μA threshold at a voltage of ≦3 volts (i.e., they were effective short circuits). For the second stress test (indicated in the figures as "2nd Pass"), the same 0-20 volt test voltage was applied to each test site. More test sites failed at the second pass than at first pass because the stress tests themselves cause those devices on the brink of failure to fail. For example, FIG. 1a shows the results of a first silicon oxynitride process, in which after the first stress test, twenty-seven of the sixty-four test sites on the first lot of wafers had a breakdown voltage of ≦3 volts. FIG. 1d shows the results of the first silicon oxynitride process, in which after the second stress test, forty-four of the sixty-four test sites on the second lot of wafers had a breakdown voltage of ≦3 volts.

FIGS. 1a to 1d show the results of a process in which silicon oxynitride was deposited as described above, and then brush cleaned for one minute. A polysilicon electrode was then formed over the silicon oxynitride. Note that no anneal cycle has been carried out. As shown in FIG. 1a, in the first lot of wafers only twenty percent of the test sites had a breakdown voltage of 10 volts when subjected to the first pass stress test (hereinafter referred to as "first pass"). More than fifty percent of the test sites had a breakdown voltage of less than 5 volts at first pass. After the second pass stress test (hereinafter referred to as "second pass"), about eighty percent of the test sites had breakdown voltages of three volts or less. While for some reason the second lot of wafers exhibited better breakdown characteristics at first pass (FIG. 1c) than did the first lot at first pass (FIG. 1a), the second pass results of the two lots are roughly consistent.

To remove the positive charge that may accumulate during deposition while increasing the density of the deposited film, an anneal may be performed in dry nitrogen or wet oxygen. In general, the $N_2$ anneal is performed in a gas flow of 20 liters/min. of $N_2$ at a temperature between 800° C. and 1000° C. In general, the wet $O_2$ anneal is performed in a 5 liter/min. gas flow of dry $O_2$ with 7 cc of $H_2O$ at a temperature between 700° C. and 1000° C.

FIGS. 2a to 2d show the results of a process wherein again a layer of silicon oxynitride is deposited on a substrate and then brush cleaned before further processing. The structure was then annealed in nitrogen at 1000° C., and a polysilicon electrode was formed over the silicon oxynitride. Upon comparing FIG. 2a with FIG. 1a it is apparent that at first pass the breakdown voltage is indeed improved. However, note that at second pass approximately sixty-nine percent of the test sites had a breakdown voltage of three volts or less, which is exactly the same result as was produced without an anneal cycle.

FIGS. 3a to 3d show the results of a silicon oxynitride process which is exactly the same as the above process, except an anneal in wet $O_2$ at 800° C. was substituted for the $N_2$ anneal. Upon comparison of FIGS. 3a to 3d with FIGS. 2a to 2d it is apparent that the wet $O_2$ anneal produced results markedly better than those obtained using the $N_2$ anneal. For both lots, substantially all of the test sites exhibited a breakdown voltage of ten volts at both first and second pass.

For some device applications, an insulating film on a silicon substrate is enough to form a storage node. However, most current high density memory cells utilize a "high capacitance" or "Hi-C" storage node, in which a thin N-type region is implanted below the insulating layer to provide a PN junction whose junction capacitance enhances the total capacitance of the storage node. Moreover, the implant region provides greater immunity to soft errors. Note that the N-type implant is given by way of example; a P-type implant could also be used. An example of a Hi-C storage node is shown in an article by Klepner, IBM Technical Disclosure Bulletin, Vol. 19, No. 2, July 1976, pages 458-459.

To form the N-type region beneath the silicon oxynitride, $As^+$ ion implantation is performed to achieve a concentration of $10^{19}$ ions/cm². In the prior art, it was shown in the above referenced Geipel patent that a wet $O_2$ anneal does not alter the As profile. The ion implantation procedure contaminates the wafer and silicon oxynitride film (with e.g., carbon). Before an electrode may be deposited on the silicon oxynitride film the contaminations should be removed by cleaning. The cleaning step may be performed by brush cleaning or ash cleaning. The film is brushed for one minute, or ash cleaned by exposure to an $O_2$ atmosphere at a pressure of 0.85 Torr at a power of 400 Watts for six minutes at room temperature. Other appropriate means of cleaning may be employed.

According to the invention, the silicon oxynitride dielectric film is annealed after the above implantation and cleaning steps. This annealing process occurs immediately prior to electrode deposition, and is the critical step in the manufacture of reliable high-capacitance silicon oxynitride storage capacitors.

Experiments were conducted wherein the silicon oxynitride was deposited, and annealed in an $N_2$ ambient or wet $O_2$ ambient. Then $As^+$ ions were implanted through the silicon oxynitride to the underlaying silicon, without a subsequent anneal. The vast majority of test sites exhibited a breakdown voltage of less than 5 volts.

FIGS. 4 to 7 show the results of processes in which a double anneal was utilized. The first anneal was carried out after the silicon oxynitride was deposited, and the second anneal was carried out after arsenic ion implantation. FIGS. 4a to 4d show the results where the first anneal was carried out in wet $O_2$ and the second anneal was carried out in an $N_2$ ambient. Note how in both first and second passes, a little less than fifty percent of the test sites exhibited a breakdown voltage of 15 volts, which is a full five volts greater than the breakdown distribution in FIGS. 1 through 3. This is because in FIGS. 4 through 7 a 12 nm layer of silicon oxynitride was formed, instead of the 8 nm layer as in FIGS. 1 through 3. However, note that upon second pass approximately fifty percent of the test sites exhibited a breakdown voltage of 1 volt or less. FIGS. 5a-5d show the results where both anneals were carried out in an $N_2$ ambient. Note that approximately sixty-six percent of the test sites exhibit a breakdown voltage of 15 volts, with only approximately twenty-five percent of the test sites exhibiting a breakdown voltage of one volt or less.

FIGS. 6 to 7 show the results when either $N_2$ or wet $O_2$ is used as the first anneal and wet $O_2$ is used as the second anneal. For both FIG. 6 (first anneal in $N_2$) and FIG. 7 (first anneal in wet $O_2$), note that none of the test sites have breakdown voltages of less than 10 volts at first pass. For both, the breakdown voltage after second pass for more than ninety percent of the test sites was 15-16 volts.

Additional experiments were carried out to optimize the temperature ranges for the processes shown in FIGS. 6 and 7. For the process shown in FIG. 6 the $N_2$ anneal temperature was kept at 1000° C. and the wet $O_2$ anneal was carried out at 600° C. to 1000° C. in 100° C. increments. For all runs, acceptable results were achieved at first pass. However, at 600° C. and 700° C., the breakdown voltages substantially declined at second pass. At 1000° C., the second pass yield was uniformally low. However, at 800° C. the second pass results were outstanding (these results are shown in FIG. 6). For the process shown in FIG. 7, the first wet $O_2$ anneal temperature was varied at 800° C., 900° C., and 1000° C., with the second wet $O_2$ anneal temperature held at 800° C. The results indicate the 800° C. range produced the best results (as shown in FIG. 7).

Therefore, we have established that an anneal carried out between 700° C. and 1000° C. in a wet $O_2$ ambient after $As^+$ ion implantation through the oxynitride layer and right before the deposition of an electrode will materially enhance the breakdown voltage of capacitors that incorporate a silicon oxynitride layer as a storage node dielectric. Typically, one would not expect the choice of wet $O_2$ anneal versus an $N_2$ anneal to have such a profound effect upon the breakdown distribution of a silicon oxynitride layer, in that the wet $O_2$ anneal provides silicon and oxygen which may reduce the dielectric constant of silicon oxynitride toward that of stoichiometric silicon dioxide.

While the invention has been described in terms of the preferred embodiments which incorporate a one or a two step annealing, where the critical annealing is performed in wet $O_2$, those skilled in the art will recognize that the specific steps and parameters may be varied in the practice of the invention within the spirit and scope of the appended claims.

Having thus described our invention, what we claim to be new and desire to secure by Letters Patent is as follows:

1. A method of forming a thin film of silicon oxynitride exhibiting a high breakdown voltage on a silicon substrate of a first conductivity type, comprising the steps of:
    forming a thin film of silicon oxynitride on the silicon substrate;
    then forming a region of a second conductivity type in at least part of the silicon substrate by ion implantation through said thin film of silicon oxynitride; and
    then annealing said silicon oxynitride film in a wet $O_2$ ambient at a temperature above 700° C. and below 1000° C.

2. The method of forming a thin film of silicon oxynitride recited in claim 1, further comprising a first annealing step performed after depositing the thin film of silicon oxynitride but before the step of forming said region of said second conductivity type in the substrate.

3. The method of forming a thin film of silicon oxynitride recited in claim 2, wherein said first annealing step is carried out in an $N_2$ ambient at a temperature of 1000° C.

4. A method of forming a capacitor structure on the surface of a semiconductor substrate of a first conductivity type, comprising the steps of:
    depositing a thin layer of silicon oxynitride on the substrate by use of a low pressure chemical vapor deposition process;
    then carrying out a first anneal on said layer of silicon oxynitride;
    then implanting dopant ions of a second conductivity type through said layer of silicon oxynitride to form an implanted region the substrate;
    then carrying out a second anneal on said layer of silicon oxynitride, said second anneal being carried out in a wet $O_2$ ambient at a temperature above 700° C. and below 1000° C.; and
    then forming an electrode on said layer of silicon oxynitride.

5. The method of forming a capacitor structure as recited in claim 4, wherein said layer of silicon oxynitride is less than approximately 15 nm in thickness.

6. The method of forming a capacitor structure as recited in claim 5, wherein said layer of silicon oxynitride has a refractive index between 1.65 and 1.85.

7. The method of forming a capacitor structure as recited in claim 4, wherein the first anneal step is carried out in a dry $N_2$ ambient at a temperature above 800° C. and below 1000° C.

8. The method of forming a capacitor structure as recited in claim 4, wherein the first anneal step is carried out in a wet $O_2$ ambient at a temperature above 700° C. and below 900° C.

9. The method of forming a capacitor structure as recited in claim 4, wherein said electrode is comprised of polysilicon.

10. A method of forming a high capacitance storage capacitor for a dynamic random access memory cell formed on a semiconductor substrate of a first conductivity type, comprising the steps of:
    forming a thin layer of silicon oxynitride on the substrate by the use of a low pressure chemical vapor deposition technique;
    then carrying out a first anneal cycle in an $N_2$ ambient at a temperature of approximately 1000° C.;
    then implanting ions of a second conductivity type through said thin silicon oxynitride layer into a surface portion of the substrate;
    then carrying out a second anneal cycle in a wet $O_2$ ambient at a temperature of approximately 800° C.; and
    then forming an electrode on said thin layer of silicon oxynitride.

* * * * *